(12) United States Patent
Nagata

(10) Patent No.: US 6,292,064 B1
(45) Date of Patent: Sep. 18, 2001

(54) VOLTAGE CONTROLLED OSCILLATOR AND SEMICONDUCTOR IC DEVICE INCLUDING A VOLTAGE CONTROLLED CAPACITOR

(75) Inventor: Kimihiko Nagata, Satsuma-gun (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/538,226

(22) Filed: Mar. 30, 2000

(30) Foreign Application Priority Data

Apr. 16, 1999 (JP) .................................................. 11-109931

(51) Int. Cl.⁷ .............................. H03B 5/12; H03L 7/099
(52) U.S. Cl. ................... 331/117 FE; 331/36 C; 331/177 V; 333/214
(58) Field of Search ............................ 331/36 C, 116 R, 331/116 FE, 117 R, 117 FE, 117 D, 177 V; 333/214

(56) References Cited

U.S. PATENT DOCUMENTS

| | | | |
|---|---|---|---|
| 3,553,609 | * | 1/1971 | Edge ........................................ 333/80 |
| 3,911,296 | * | 10/1975 | Davis ..................................... 307/297 |
| 4,025,867 | * | 5/1977 | Seidel .................................... 328/127 |
| 4,071,830 | * | 1/1978 | Huntington ........................... 330/277 |
| 4,644,306 | * | 2/1987 | Kleinberg ............................ 333/214 |
| 5,508,662 | * | 4/1996 | Guichard et al. ....................... 331/65 |
| 6,037,843 | * | 3/2000 | Hunt ................................. 331/177 V |

\* cited by examiner

*Primary Examiner*—David Mis
(74) *Attorney, Agent, or Firm*—Armstrong, Westerman, Hattori, McLeland & Naughton, LLP

(57) ABSTRACT

A voltage controlled oscillator (VCO) having an amplifier including a field-effect transistor (FET). The VCO includes a voltage controlled capacitor having an inversion amplifier including an FET, an amp gain of the inversion amplifier being controlled by a voltage; and a capacitor connected between an input and an output of the inversion amplifier.

4 Claims, 9 Drawing Sheets

VOLTAGE CONTROLLED OSCILLATOR AND SEMICONDUCTOR IC DEVICE INCLUDING A VOLTAGE CONTROLLED CAPACITOR

BACKGROUND OF THE INVENTION

1. Field of the Invention

The present invention relates generally to a voltage controlled oscillator (VCO) and semiconductor integrated circuit (IC) device, and more particularly, to a compact voltage controlled oscillator comprising a field-effect transistor (FET) IC.

2. Description of the Related Art

Recent developments in the field of mobile communications devices, in particular cellular telephones, mobile communications equipment and cordless telephones, have resulted in rapid reductions in both the size and price of such equipment. As a result, there is an ever-increasing need to reduce the number of component parts of such devices as well as to reduce the unit costs of such parts. It is for these reasons that the need has arisen to include the voltage controlled oscillator (hereinafter referred to as a VCO) used as a modulation/demodulation circuit in such devices within a complementary metal-oxide semiconductor (CMOS) integrated circuit (IC).

The following can be given as an example of a conventional VCO.

FIG. 1 is a circuit diagram of a conventional VCO 100, in this case a Colpitts type VCO 100 using a bipolar transistor 101. The VCO 100 comprises the bipolar transistor 101 as well as condensers 102, 103, 104, 105, a resistor 108, an inductor 106 and a varicap 107. A collector of the transistor 101 is connected to one terminal of the resistor 108, the other terminal of the resistor 108 being connected to a power source 109.

An emitter of the transistor 101 is connected to one terminal of condenser 102. The other terminal of the condenser 102 is connected to one terminal of condenser 103 and a base of transistor 101. One terminal of condenser 104 is connected to the base of transistor 101, the other terminal of condenser 104 being connected to one terminal of condenser 105 and one terminal of inductor 106. The other terminal of inductor 106 is connected to a ground 110. The other terminal of condenser 105 is connected to a cathode of varicap 107, an anode of varicap 107 being connected to the ground 110. A control voltage 111 is applied at the point of connection between the condenser 105 and the cathode of the varicap 107. By inputting a control voltage 111 at the junction between the condenser 105 and the varicap 107 a voltage applied to the varicap 107 is controlled, the capacitance of the varicap 107 is changed and the oscillation frequency is changed.

FIG. 2 is a diagram for the purpose of describing a conventional CMOS ring-type VCO 200, in which the CMOS inverters are connected in a ring. An NMOS transistor 201 and a PMOS transistor 204 form the first inverter, an NMOS transistor 202 and a PMOS transistor 205 form the second inverter, and an NMOS transistor 203 and a PMOS transistor 206 form the third inverter. An output 211 of the first inverter formed by the NMOS transistor 201 and the PMOS transistor 204 is connected to a gate of NMOS transistor 202, an output 212 of the second inverter formed by the NMOS transistor 202 and the PMOS transistor 205 is connected to a gate of NMOS transistor 202, and an output 210 of the third inverter formed by the NMOS transistor 203 and the PMOS transistor 206 is connected to a gate of NMOS transistor 201, thus connecting in a shape of a ring.

The gates of PMOS transistors 204, 205, 206 are jointly connected and are controlled by a control voltage 209. The current flowing through PMOS transistors 204, 205, 206 is controlled according to the value of the control voltage 209, thus controlling the extent of the delay of each of the inverters connected in the ring and controlling the oscillation frequency.

FIG. 3 is a diagram for the purpose of describing a conventional CMOS inverter VCO, in which the VCO 300 uses CMOS inverters. The VCO 300 comprises an inverter 301, resistor 302, condenser 303, crystal resonator 304, condenser 305, varicap 306 and resistor 307. The resistor 302 and crystal resonator 304 are connected to an input terminal and an output terminal of the inverter 301. The condenser 303 is connected between the output terminal of the inverter 301 and the ground. One terminal of the condenser 305 is connected to the input terminal of the inverter 301 and the other terminal of the condenser 305 is connected to a cathode of the varicap 306. An anode of the varicap 306 is connected to the ground.

One terminal of the resistor 307 is connected to the point of connection between the condenser 305 and the varicap 306, a control voltage 308 being applied to the other terminal of the resistor 307. By controlling the voltage applied to the varicap 306 from the control voltage 308, the capacitance of the varicap 306 is changed and the oscillation frequency of the output signal of the inverter 309 is changed as well.

However, the conventional voltage controlled oscillators described above have the following problem.

The Colpitts type VCO 100 using the bipolar transistor 101 shown in FIG. 1 uses the varicap diode 107. Forming this varicap diode 107 on a semiconductor chip would require a large surface area and would make large-scale integration impractical. Additionally, the varicap diode 107 is difficult to form using the CMOS process widely used for current logic circuits. That is, without using a mixed bipolar/CMOS process the VCO 100 cannot be formed on the same chip as the logic circuit. As a result, in order to form the VCO 100 on the same semiconductor chip as the logic circuit, a mixed bipolar/CMOS process is used. However, such a mixed bipolar/CMOS process complicates the production process and increases the cost of the IC so produced.

Additionally, the CMOS ring-type VCO 200 shown in FIG. 2, in which an odd number of individual CMOS inverters are connected in rings, has the following problem.

The individual NMOS transistors 201, 202, 203 basically operate at saturation, so a rectangular oscillating wave is the form of the oscillator output 210. Since the wave form is a rectangular wave, distortion is high and the carrier-to-noise ratio (C/N) is low.

Moreover, the VCO 300 using the CMOS inverter 301 shown in FIG. 3 has the following problem.

The VCO 300 shown in FIG. 3 uses the crystal resonator 304. As a result, changing the control voltage 308 from a minimum value near ground level to a maximum value near the supply voltage only changes the frequency by about 10 kHz, so the operating range is narrow.

SUMMARY OF THE INVENTION

Accordingly, it is a general object of the present invention to provide an improved and useful a voltage controlled oscillator (VCO) and semiconductor integrated circuit (IC) device, wherein the foregoing problems are eliminated.

Another and more specific object of the present invention is to provide a VCO capable of being formed by a CMOS process, having a small surface area, a high oscillation signal C/N ratio, low distortion and broad operating frequency range.

The above-described objects of the present invention are achieved by a voltage controlled oscillator (VCO) having an amplifier including a field-effect transistor (FET), the VCO comprising a voltage controlled capacitor, the voltage controlled capacitor comprising an inversion amplifier comprising an FET, an amp gain of the inversion amplifier being controlled by a voltage; and a capacitor connected between an input and an output of the inversion amplifier.

According to the invention described above, the oscillation frequency can be can be controlled, thus making it possible to provide a VCO formed from FETs from which an oscillating sine wave form can be obtained.

Additionally, the above-described objects of the present invention are also achieved by a semiconductor semiconductor integrated circuit (IC) device including a voltage controlled oscillator (VCO) having an amplifier including a field-effect transistor (FET), the VCO comprising a voltage controlled capacitor, the voltage controlled capacitor comprising an inversion amplifier comprising an FET, an amp gain of the inversion amplifier being controlled by a voltage; and a capacitor connected between an input and an output of the inversion amplifier.

According to the invention described above, the oscillation frequency can be can be controlled, thus making it possible to provide a semiconductor IC device including a VCO formed from MOS transistors from which an oscillating sine wave form can be obtained.

The above-described objects of the present invention are also achieved by an electronic device including a voltage controlled oscillator (VCO), the electronic device comprising:

the voltage controlled oscillator (VCO) comprising a voltage controlled capacitor, the voltage controlled capacitor comprising an inversion amplifier comprising an FET, an amp gain of the inversion amplifier being controlled by a voltage; and a capacitor connected between an input and an output of the inversion amplifier; and a controller controlling an oscillation frequency of the VCO.

According to the invention described above, the oscillation frequency can be can be controlled, thus making it possible to provide an electronic device including a VCO formed from FETs from which an oscillating sine wave form can be obtained.

Other objects, features and advantages of the present invention will become more apparent from the following detailed description when read in conjunction with the accompanying drawings.

DESCRIPTION OF THE PREFERRED EMBODIMENTS

A description will now be given of preferred embodiments of the present invention, with reference to the accompanying drawings.

Figure 1:
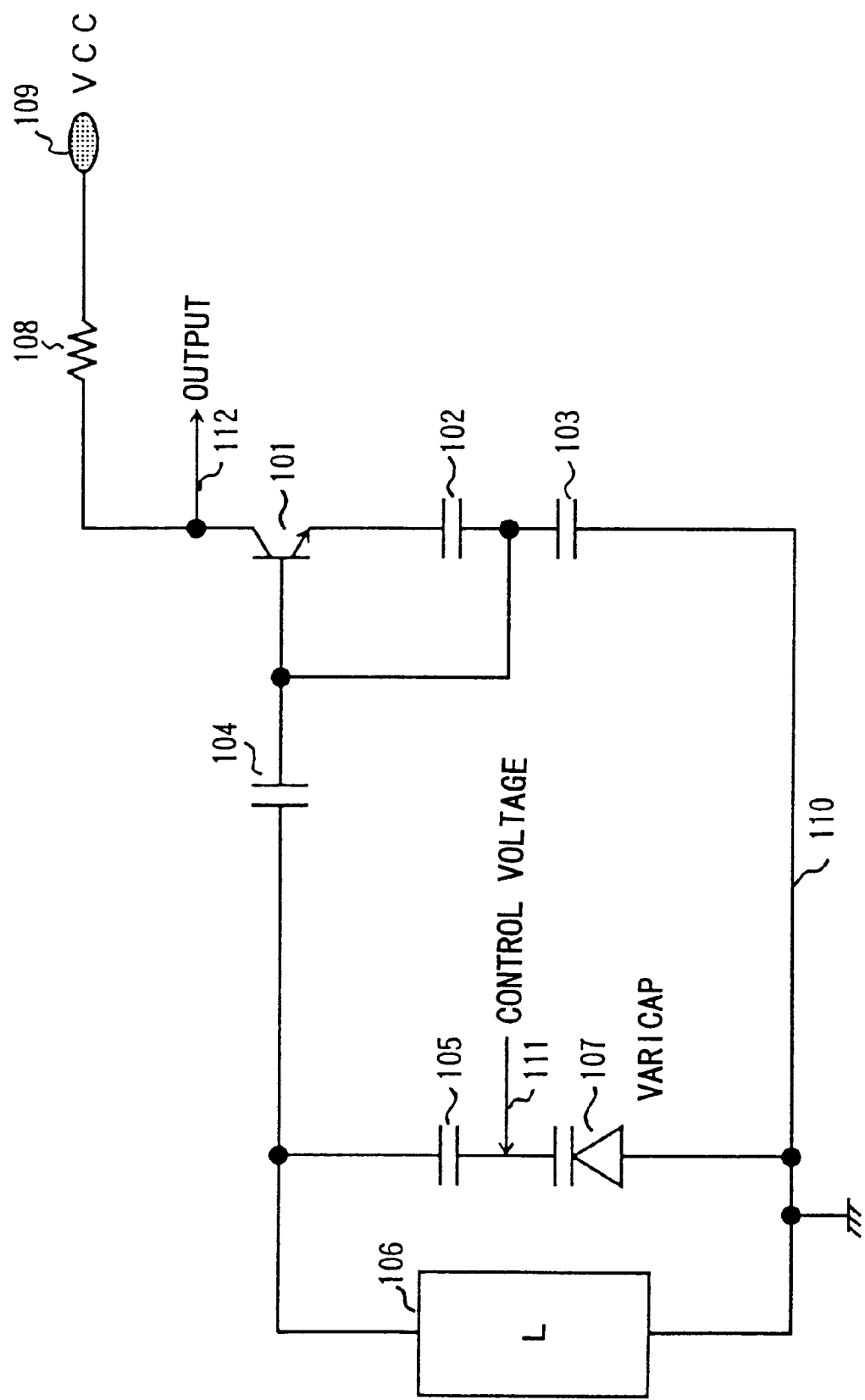
FIG. 1 is a circuit diagram of a conventional VCO.
Figure 2:
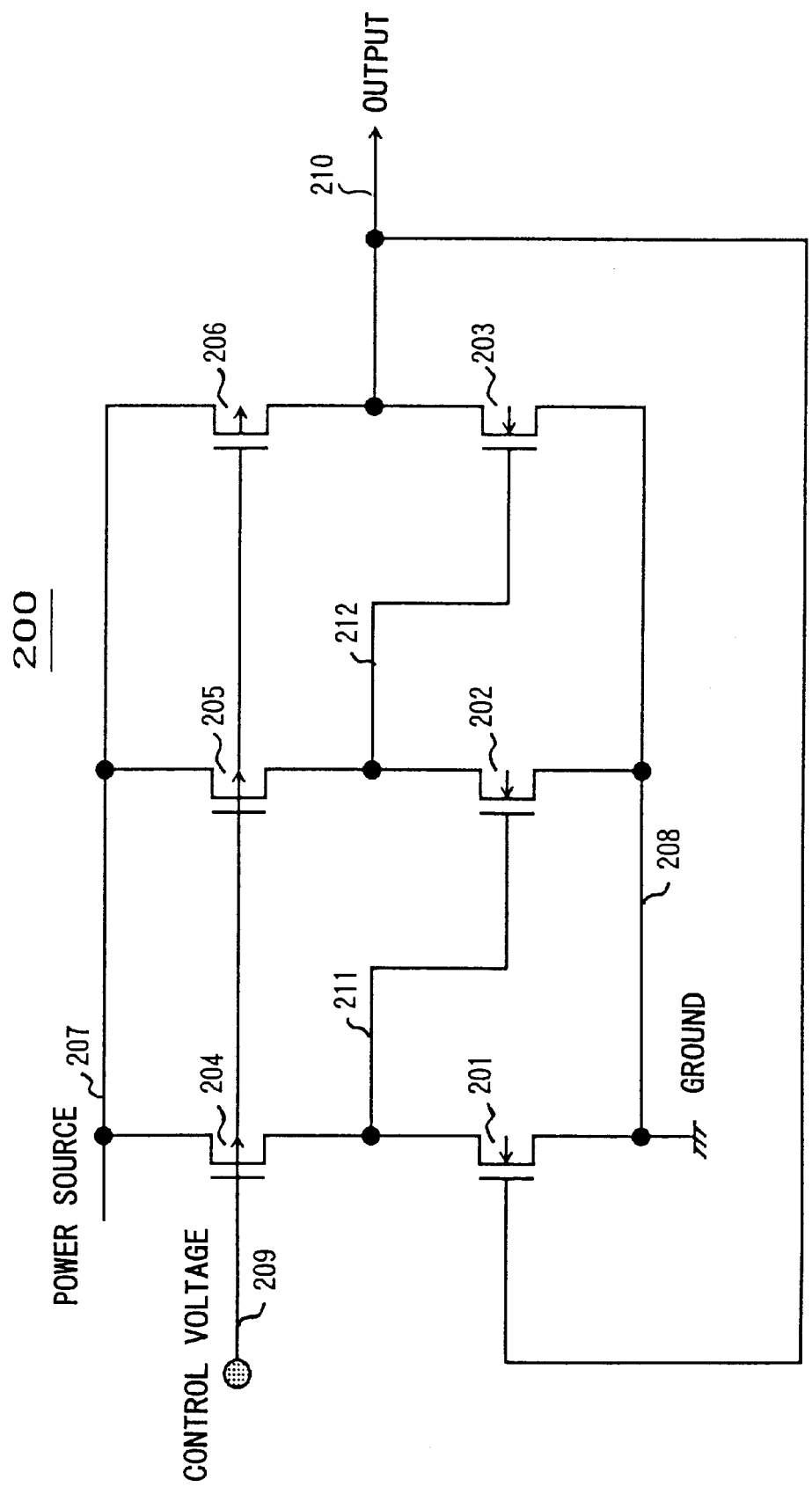
FIG. 2 is a diagram for the purpose of describing a conventional CMOS ring-type VCO.
Figure 3:
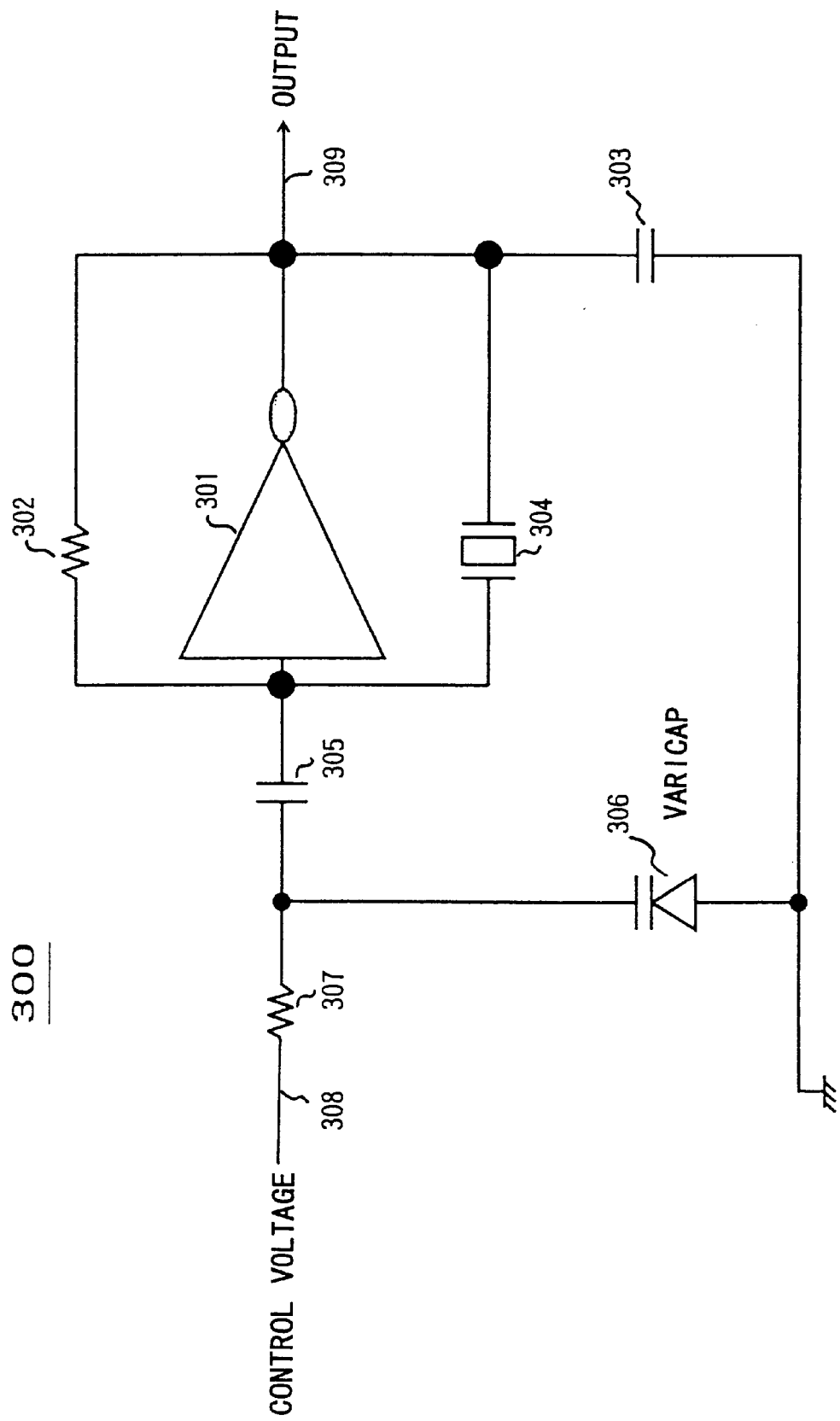
FIG. 3 is a diagram for the purpose of describing a conventional CMOS inverter VCO.
Figure 4:
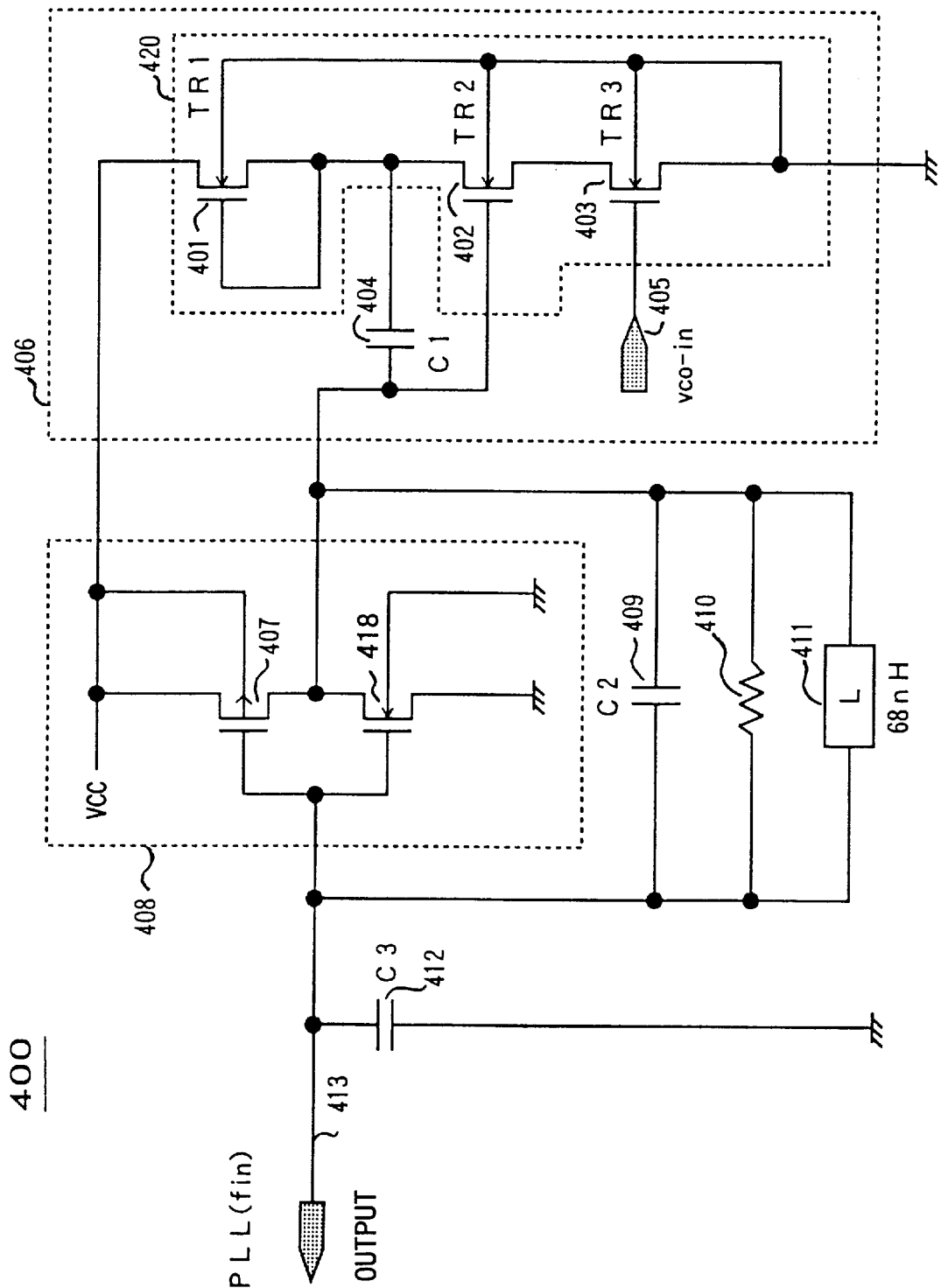
FIG. 4 is a diagram of a Miller capacitor VCO circuit of a first embodiment of the present invention.

FIG. 4 is a diagram of a Miller capacitor VCO circuit of a first embodiment of the present invention, in which the VCO 400 comprises a Miller capacitor 406 and a CMOS inverter 408.

For convenience, a description will first be given of the Miller capacitor 406.

The Miller capacitor 406 is a voltage-current capacitor including, first, an inversion amplifier 420 comprising an FET and in which an amp gain is controlled by a voltage, and second, a capacitor 404 connected between the input and output of the inversion amplifier 420.

A drain of the NMOS transistor 401 is connected to the power source VCC and a gate of the NMOS transistor 401 is connected to a source of the NMOS transistor 401. The source of the NMOS transistor 401 is connected to a drain of NMOS transistor 402, and a source of the NMOS transistor 402 is connected to a drain of NMOS transistor 403. A source of NMOS transistor 403 is connected to a ground, and a control input voltage 405 is input to a gate of the NMOS transistor 403. Additionally, the back gates of NMOS transistors 401, 402, 403 are connected to the ground. Together, these NMOS transistors 401, 402, 403 form the inversion amplifier 420 that changes the amplifier gain according to the voltage value of the control voltage 405.

Additionally, a condenser 404 is connected between the drain and the gate of NMOS transistor 402, forming the Miller capacitor 406. When the Miller capacitor 406 feeds back a capacitance C1 via the condenser 404 to the input/output of the inversion amplifier 420 having an amp gain (−α), the input impedance of the inversion amplifier 420 as seen from the input terminal becomes (130 α) times the capacitance C1. Additionally, in the present embodiment, the NMOS transistors 401, 402, 403 themselves interfere with the oscillation, so in order to prevent this the length of the channel is lengthened so as to be large for a standard size transistor formed on the same chip, thus making the channel resistance 10 or more times greater than that of a standard size transistor. At the same time, the gates and the drains of PMOS transistor 407 and NMOS transistor 408 are connected to each other to form CMOS inverter 408. The PMOS transistor 407 source is connected to the power source VCC. Additionally, the NMOS transistor 408 source is connected to the ground. The back gate of PMOS transistor 407 is connected to the power source VCC and the back gate of NMOS transistor 408 is connected to the ground.

A condenser 409, inductor 411 and resistor 410 are connected between the gate of the PMOS transistor 407 that is the input of inverter 408 and the drain of the NMOS transistor 407 that is the output. Additionally, a condenser 412 is connected between the gate of PMOS transistor 407 and the ground, the Miller capacitor 406 is connected to the drain of PMOS transistor 407 to form the voltage controlled oscillator 400. The CMOS inverter 408 comprising PMOS transistor 407 and NMOS transistor 408 is the amplifier of the oscillation signal, with the oscillation frequency being determined by the resonance frequency of the condenser 409, 412, Miller capacitor 406 and inductor 411. If the amp gain of the inversion amplifier 420 comprising MOS transistors 401, 402, 403 is $(-\alpha)$, the inductance of the inductor 411 is L, the capacitance of the condenser 404 is C1, the capacitance of the condenser 409 is C2 and the capacitance of the condenser 412 is C3, then the oscillation frequency f is given by the following formula:

$$f = \frac{1}{2}(2\pi \times \sqrt{(L \times C)}) \quad (1)$$

Where $$Cox = 1/((1/C3) + (1/((1+\alpha) \times C1))) \quad (2)$$

$$C = Cox + C2 \quad (3)$$

Figure 5:
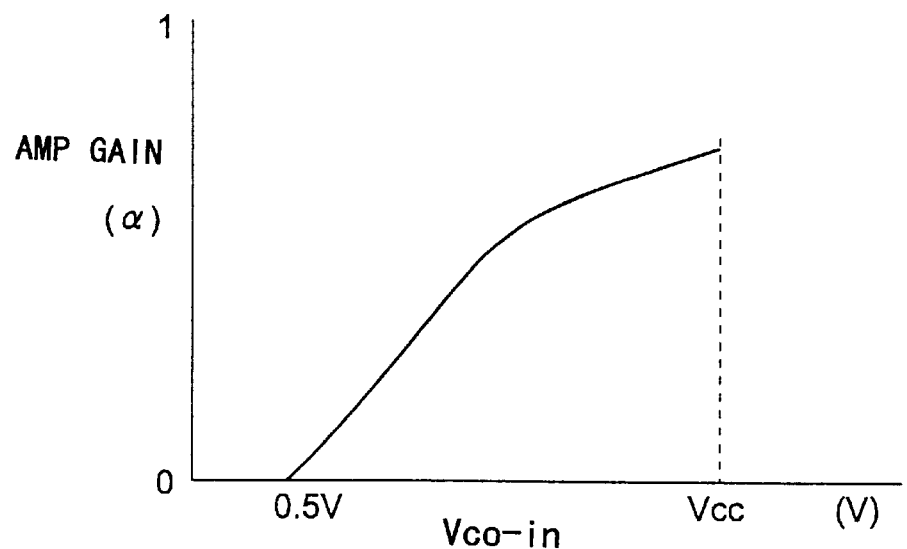
FIG. 5 is a graph showing the relation between control voltage Vco-in and amplifier gain of a first embodiment of the present invention.

FIG. 5 is a graph showing the relation between control input voltage Vco-in 405 of the VCO 400 according to the first embodiment of the present invention and amp gain absolute value $\alpha$ of the inversion amplifier 420.

As the control input voltage Vco-in 405 increases, the amp gain absolute value $\alpha$ also increases. Accordingly, the Miller capacitor 406, as the control input voltage 405 increases, also increases. In so doing and according to formula 2, the combined capacitance Cox of condenser 412 and Miller capacitor 406 increases.

Figure 6:
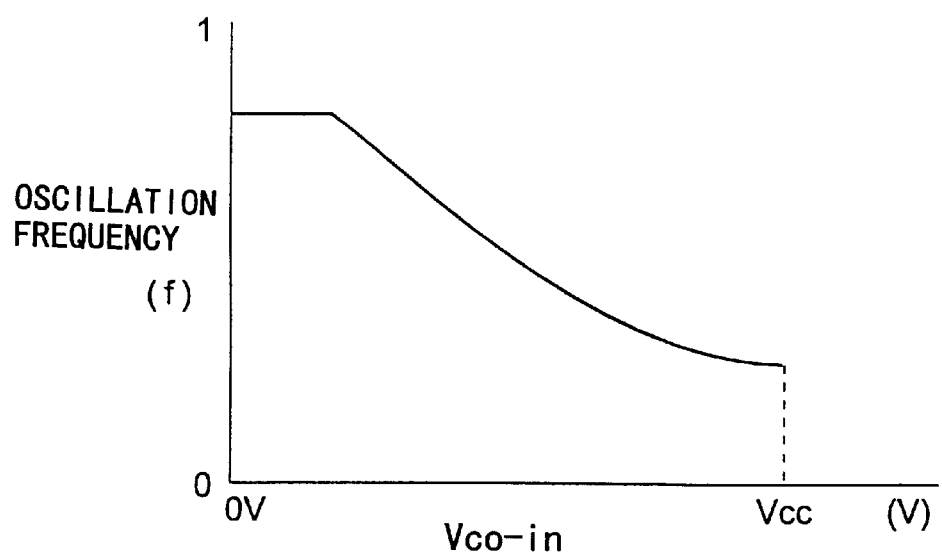
FIG. 6 is a graph showing the relation between control voltage Vco-in and oscillation frequency of a first embodiment of the present invention.

FIG. 6 is a graph showing the relation between control input voltage Vco-in 405 of the VCO 400 according a first embodiment of the present invention and oscillation frequency of a VCO output signal 405. According to formula 2, when the control input voltage 405 increases, the combined capacitance Cox of the condenser 412 and the Miller capacitor 406 increases. In so doing and according to formulas (3) and (1), the oscillation frequency of the VCO output signal 413 decreases.

As described above, according to the first embodiment of the present invention the oscillation frequency can be controlled by a frequency varying means using a Miller capacitor 406 formed from a MOS transistor amplifier 420, so a VCO 400 formed by MOS transistors using a CMOS process can be achieved. Additionally, the Miller capacitor 406 according to the first embodiment of the present invention as described above has only approximately one fourth the surface area of the varicaps currently in use, so the VCO 400 formed on the IC can be reduced in size. Additionally, oscillation is conducted by resonance of the condenser and the inductor, so the oscillation signal is a sine wave. Accordingly, distortion is low and the carrier to noise C/N ratio is high.

A description will now be given of a second embodiment of the present invention, with reference to the accompanying drawings.

Figure 7:
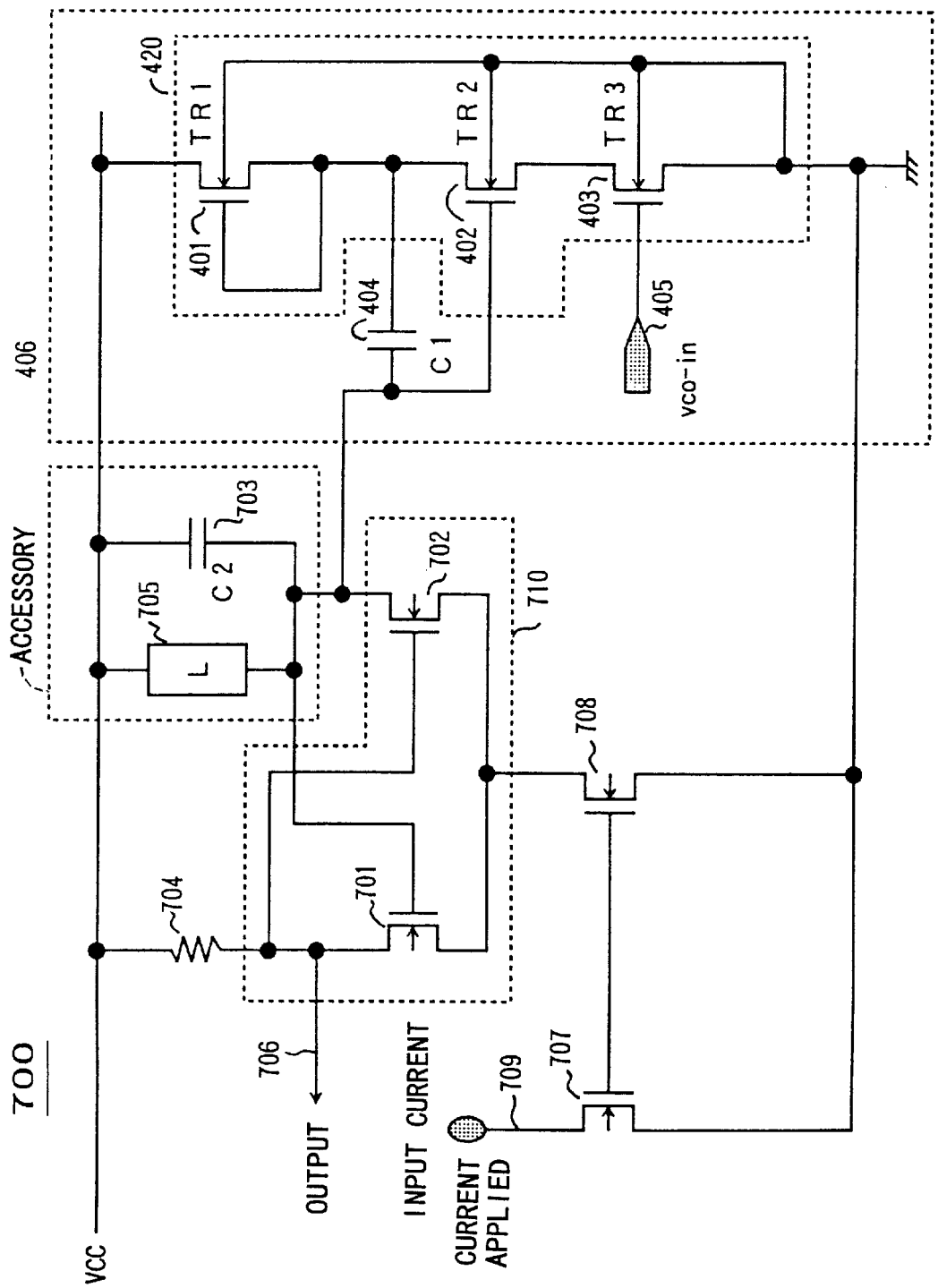
FIG. 7 is a diagram of a Miller capacitor VCO circuit of a second embodiment of the present invention.

FIG. 7 is a diagram of a Miller capacitor VCO circuit according to a second embodiment of the present invention. As shown in the diagram, the VCO 700 comprises a Miller capacitor 406 and a multivibrator 710 formed from MOS transistors. It should be noted that the Miller capacitor 406 shown in FIG. 7 is identical to that shown in FIG. 4.

A drain of NMOS transistor 701 is connected to a gate of NMOS transistor 702. A drain of NMOS transistor 702 is connected to a gate of NMOS transistor 701. Additionally, a source of NMOS transistor 701 and a source of NMOS transistor 702 are connected to each other to form the multivibrator 710.

A source of NMOS transistor 708 is connected to a ground, a drain of NMOS transistor 708 is connected to the sources of NMOS transistors 701, 702 that form the multivibrator 710 and a current is supplied to the multivibrator 710. A gate of NMOS transistor 708 is connected to a gate of NMOS transistor 707 so that NMOS transistors 707, 708 together form a current-mirror circuit. A source of NMOS transistor 707 Is connected to a ground. A drain of NMOS transistor 707 is connected to a current input terminal 709 and current is input from the current input terminal 709. The current flowing through NMOS transistor 707 is the same strength as the current flowing through NMOS transistor 708, and is supplied to the multivibrator 710. The current flowing through NMOS transistor 708 is divided between NMOS transistors 701, 702 according to the value of the voltage across the gate and source of NMOS transistors 701, 702 that together form the multivibrator 710.

A resistor 704 is connected between the drain of NMOS transistor 701 and the power supply VCC, and an inductor 705, a condenser 703 and a Miller capacitor 406 706 are connected between the drain of NMOS transistor 702 and the power supply VCC, to form the VCO 700. It should be noted that, if the circuit is a semiconductor IC and the inductor 705 and the condenser 703 cannot be formed inside the semiconductor IC, then the inductor 705 and the condenser 703 are formed outside the semiconductor IC.

If the amp gain of the inversion amplifier 420 formed by the NMOS transistors 701, 702, 703 is $(-\alpha)$, the inductance L of the inductor 705 is L, the capacitance of the condenser 404 is C1 and the capacitance of the condenser 703 is C2, then the oscillation frequency f can be obtained by the following formula:

$$F = 1/(2\pi \times \sqrt{(L \times (C2 + C1(1+\alpha)))}) \quad (4)$$

As the control input voltage 405 increases the absolute value $\alpha$ of the amp gain of the inversion amplifier 420 also increases. Accordingly, as shown in formula (4) above, the oscillation frequency decreases.

As described above, according to the present invention, the oscillation frequency can be controlled by the Miller capacitor 406 using an amplifier formed by MOS transistors, so a VCO 400 formed by MOS transistors using a CMOS process can be achieved. Additionally, the Miller capacitor 406 according to the second embodiment of the present invention as described above has only approximately one fourth the surface area of the varicaps currently in use, so the VCO 700 formed on the IC can be reduced in size. Additionally, the oscillation frequency is determined by resonance of the condenser and the inductor, so the oscillation signal is a sine wave. Accordingly, the carrier to noise C/N ratio is high and distortion is low.

Next, a description will be given of a third embodiment of the present invention, with reference to the accompanying drawings.

Figure 8:
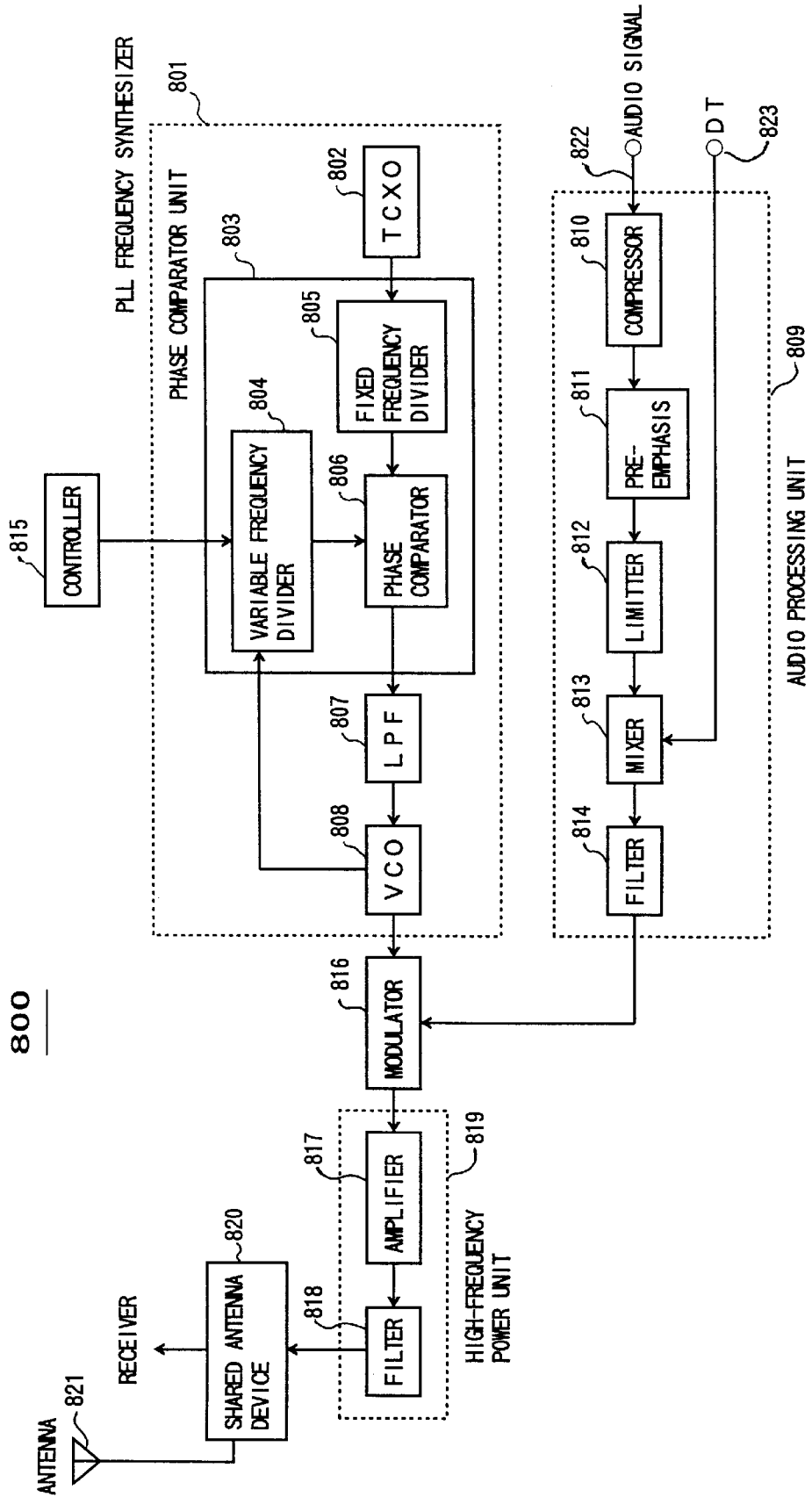
FIG. 8 is a circuit diagram of the transmitter unit of the transmitter-receiver of the present invention.

FIG. 8 is a circuit diagram of a transmitter unit of the transmitter-receiver of the present invention.

As shown in FIG. 8, the transmitter 800 chiefly comprises a PLL frequency synthesizer 801, an audio processing unit 809, a PLL frequency synthesizer controller 815, a modulator 816, a high-frequency power unit 819, an antenna sharing device 820 and an antenna 821. The PLL frequency synthesizer 801 comprises a reference frequency signal source 802, a VCO 808, a low-pass filter 807 and a phase comparator 803. In the phase comparator unit 803, a phase of the signal into which the output signal of the reference frequency signal source 802 is divided by the fixed frequency divider 805 and a phase of the signal into which the output signal of the VCO 808 is divided by the variable frequency divider 804 are compared by the phase comparator 806 and a phase differential signal is output to the low-pass filter 807. The phase differential signal from which the high-frequency component has been removed is then input to the VCO 808 and the VCO 808 oscillation frequency is controlled. The frequency of the signal that the VCO 808 outputs within the PLL frequency synthesizer 801 can be set to a desired frequency by using the controller 815 to set the frequency dividing ratio of the variable frequency divider 804 to a desired value. The transmission frequency of the transmitter 800 is set by setting the frequency dividing ratio of the variable frequency divider 804 using the controller 815. Additionally, the VCO 808 can be formed on a CMOS IC together with the phase comparator 803 that is itself formed chiefly from logic circuits.

The audio signal 822 and the data (DT) 823 to be transmitted are input to the audio processing unit 809. The audio signal 822 is first compressed by the compressor 810 and is then pre-emphasized by the pre-emphasis unit 811 and amplitude limited by a limiter 812, after which it is input to a mixer 813. The mixer 813 mixes the above-described audio signal with the data DT and, after filtering the audio signal by the filter 814, inputs same to the modulator and modulates the VCO 808 output signal.

The modulator 816 output signal is input to the high-frequency power unit 819. The high-frequency power unit 819, after the output signal has been amplified by an amplifier 817, then filters the output signal via the filter. After being amplified by the high-frequency power unit 819, the filtered transmission signal is sent to the antenna sharing device 820 via the antenna 821 and transmitted.

Figure 9:
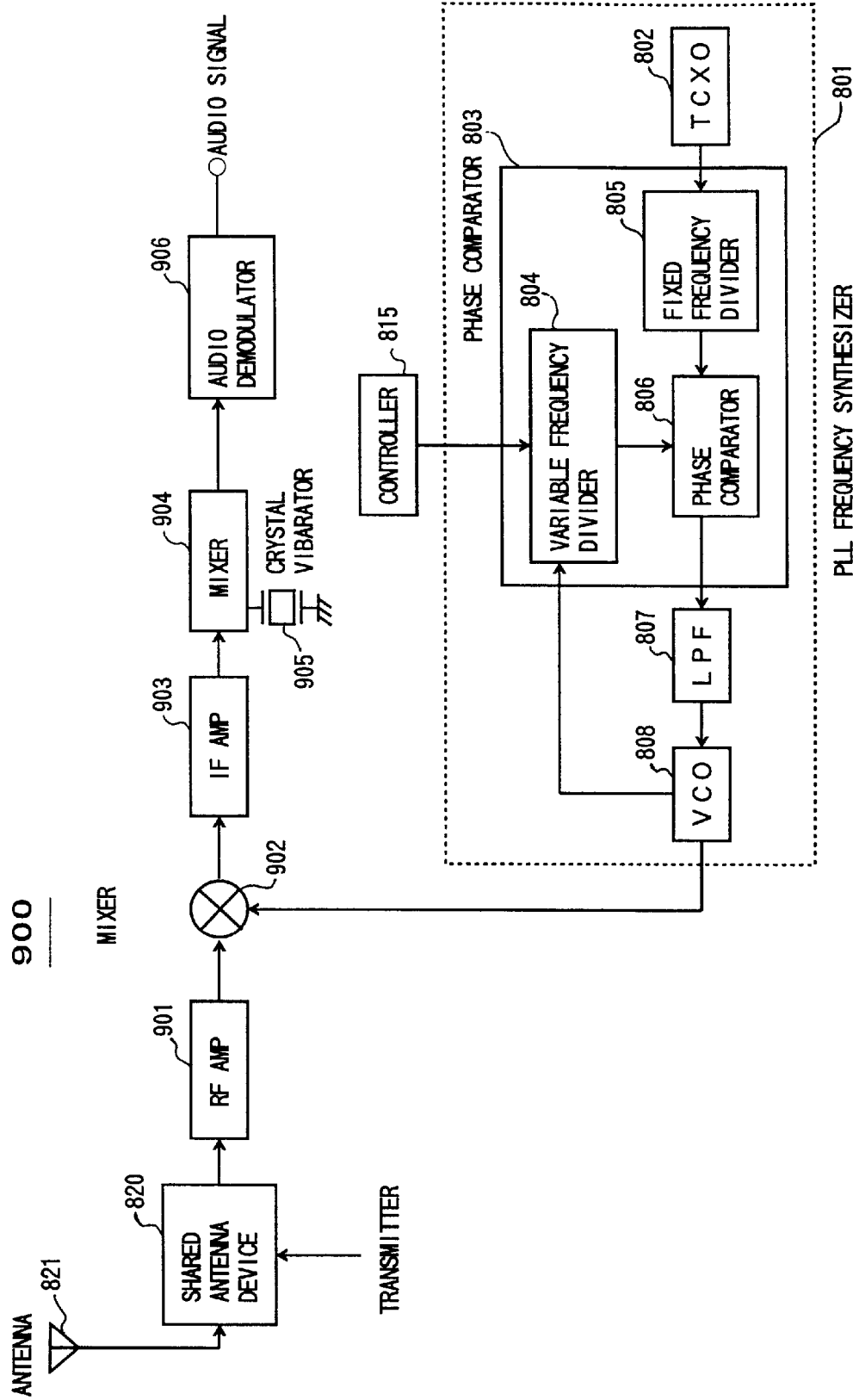
FIG. 9 is a circuit diagram of the receiver unit of the transmitter-receiver of the present invention.

FIG. 9 is a circuit diagram of a receiver unit of the transmitter-receiver of the present invention. The receiver unit 900 chiefly comprises a PLL frequency synthesizer 801, a PLL frequency synthesizer controller 815, an antenna 821, an antenna sharing device 820, and RF amplifier 901, a mixer 902, an IF amplifier 903 a mixer 904 and an audio demodulator 906. The PLL frequency synthesizer 801 and the controller 815 are identical to those shown in FIG. 8. First, the reception frequency of the receiver 900 is set by setting the frequency dividing ratio of the variable frequency divider 804 using the controller 815.

The reception signal received at the antenna 21 is sent to the RF amplifier 901 via the antenna sharing device 820. At the RF amplifier 901, the weak signal received at the antenna 821 is amplified. Next, at the mixer 902 the output signal of the PLL frequency synthesizer 801 and the output signal of the RF amplifier 901 are mixed. Next, the output signal of the mixer 902 is amplified by the intermediate-frequency amplifier 903. Further, the signal amplified at the IF amplifier 903 and the reference signal of the frequency determined by the oscillation frequency of the crystal resonator 904 are mixed and then sent to the audio demodulator 906. At the audio demodulator 906 the audio signal is demodulated and output.

As described above, according to the present embodiment a transmitter-receiver using a PLL frequency synthesizer using the VCO of the present invention can be provided. Additionally, it should be noted that while the present embodiment is a transmitter-receiver adapting the present invention, the invention is not limited to such embodiment but may be used in a variety of electronic devices such as a transceiver, a communications device, a radio receiver, a television receiver and a portable telephone.

Next, a description will be given of a fourth embodiment of the present invention, with reference to the accompanying drawings.

Figure 10:
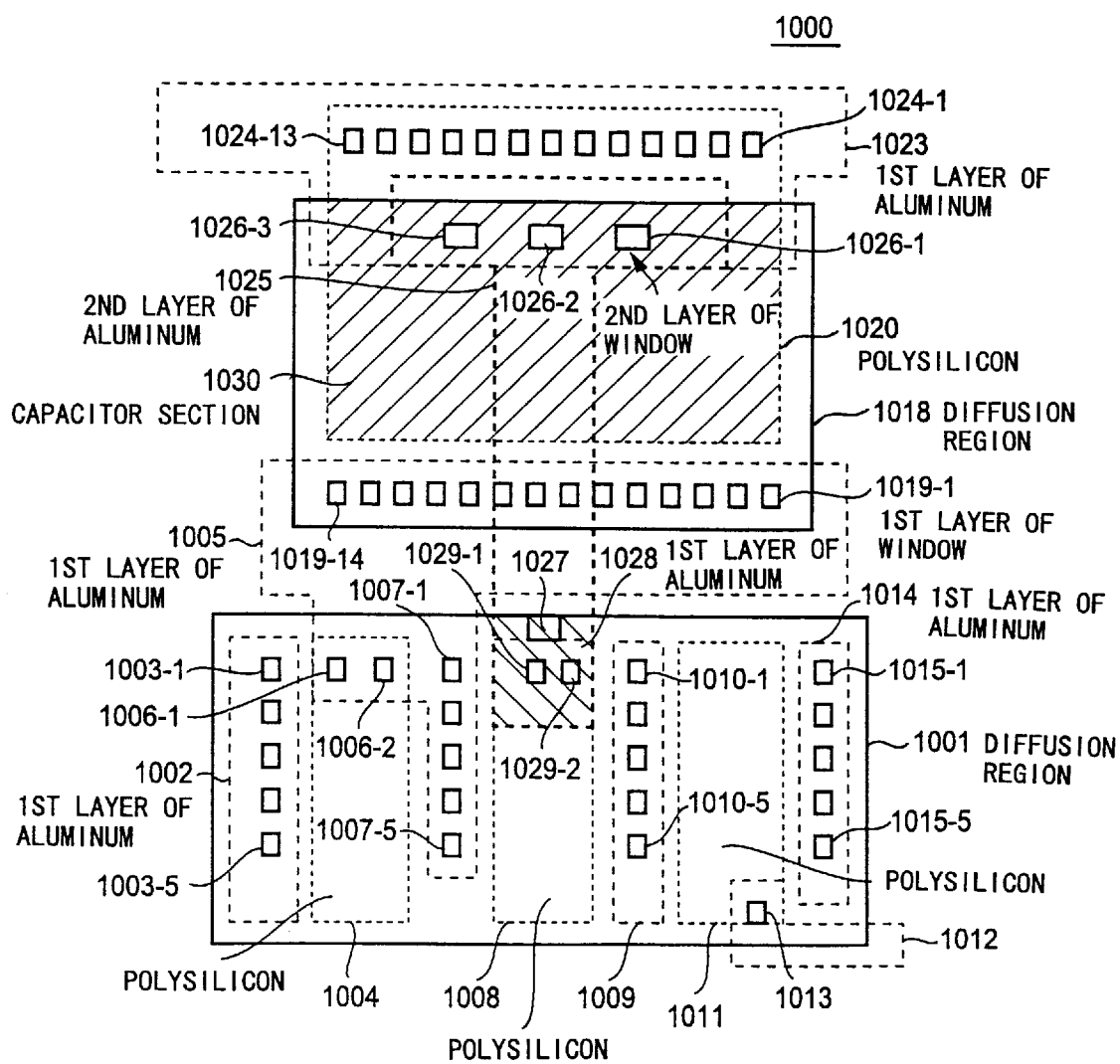
FIG. 10 is a diagram showing one structure of the Miller capacitor of the present invention.

FIG. 10 is a diagram showing the Miller capacitor 1000 of the present invention atop a semiconductor IC. The Miller capacitor 1000 comprises 3 NMOS transistors on a diffusion region 1001 and a capacitor formed on another diffusion region 1018.

A description will now be given of the correspondence between the formation of the Miller capacitor 1000 on the IC shown in FIG. 10 and the Miller capacitor 406 of which FIG. 4 shows a circuit diagram.

First, a description will be given of the three NMOS transistors formed on the diffusion region 1001.

The polysilicon 1004, 1008 and 1011 form the gates of the NMOS transistors. More specifically, polysilicon 1004 forms the gate of the NMOS transistor 401 shown in FIG. 4, polysilicon 1008 forms the gate of the NMOS transistor 402 shown in FIG. 4 and polysilicon 1011 forms the gate of NMOS transistor 403. The drain of NMOS transistor 401 is formed on the diffusion region 1001 between a left edge of the diffusion region 1001 and the polysilicon 1004. The first layer of aluminum 1002 is connected to the drain of NMOS transistor 401 formed on the diffusion region 1001 by first layer windows 1003-1 through 1003-5. Additionally, the first layer of aluminum 1002 is connected to the power supply VCC.

The source of NMOS transistor 401 and the drain of NMOS transistor 402 are formed on the diffusion region 1001 sandwiched between polysilicon 1004 and polysilicon 1008. The two portions comprising the source of NMOS transistor 401 and the drain of NMOS transistor 402 are formed as one region of the diffusion region 1001. The source of NMOS transistor 401 is connected to the first aluminum layer 1005 by the first layer windows 10071-1 through 1007-5, and the first layer of aluminum 1005 is connected to the polysilicon 1004 that is the gate of NMOS transistor 401 by the first layer windows 1006-1 and 1006-2.

The source of NMOS transistor 402 and the drain of NMOS transistor 403 are formed on the diffusion region 1001 between the polysilicon 1008 and polysilicon 1011. The two portions that are the source of NMOS transistor 402 and the drain of NMOS transistor 403 are formed as one region on the diffusion region 1001. The source of NMOS transistor 402 is connected to the first aluminum layer 1009 by the first layer windows 1010-1 through 1010-5.

The source of NMOS transistor 403 is formed on the diffusion region 1001 between the right edge of the diffusion region 1001 and the polysilicon 1011. The first aluminum layer 1014 is connected to the source of the NMOS transistor 401 formed on the diffusion region 1001 by the first layer windows 1015-1 through 1015-5. Additionally, the first aluminum layer is connected to a ground. The polysilicon 1011 that is the gate of NMOS transistor 403 is connected to the first aluminum layer 1012 by the first layer window 1013 and a control voltage 405 is input from the first aluminum layer 1012. In this manner the three NMOS transistors are formed on the diffusion region 1001.

Next, a description will be given of the structure of the capacitor 404 that forms the Miller capacitor 1000 shown in FIG. 4. The capacitor 404 is formed in the slanted line portion 1030 where the diffusion region 1018 and the polysilicon 1020 overlap. The first aluminum layer 1005, as described previously, is connected to the gate and the source of NMOS transistor 401 and the drain of NMOS transistor 402. The first aluminum layer 1005 is connected to the diffusion region 1018 by the first layer windows 1019-1 through 1019-14. The diffusion region 1018 forms one electrode of the capacitor 404. The other electrode of the capacitor 404 is formed by the polysilicon 1020. The layer between the diffusion region 1018 and the polysilicon 1020 is an oxide layer, so the two electrodes are separated. By so doing, the capacitor 404 is formed in the slanted line portion where the diffusion region 1018 and the polysilicon 1020 overlap. The polysilicon 1020 is connected to the first aluminum layer 1023 by the first layer windows 1024-1 through 1024-13. The first aluminum layer 1023 is connected to the second aluminum layer 1025 by the second layer windows 1026-1 through 1026-3. The second aluminum layer 1025 is connected to the first aluminum layer 1028 by the second layer window 1027. The first aluminum layer 1028 is formed in the slanted line portion. The first aluminum layer 1028 is connected to the polysilicon 1008 that is the gate of NMOS transistor 402 by first layer windows 1029-1 and 1029-2.

As described above, according to the present embodiment the Miller capacitor 406 circuit shown in FIG. 4 can be formed on top of the semiconductor IC.

The above description is provided in order to enable any person skilled in the art to make and use the invention and sets forth the best mode contemplated by the inventors of carrying out their invention.

The present invention is not limited to the specifically disclosed embodiments, and variations and modifications may be made without departing from the scope and spirit of the present invention.

The present application is based on Japanese Priority Application No. 11-109931, filed on Apr. 2, 1999, the entire contents of which are hereby incorporated by reference.

What is claimed is:

1. A voltage controlled oscillator (VCO) having an amplifier including a field-effect transistor (FET), the VCO comprising a voltage controlled capacitor, the voltage controlled capacitor comprising:

an inversion amplifier comprising an FET, an amp gain of the inversion amplifier being controlled by a voltage; and a capacitor connected between an input and an output of the inversion amplifier.

2. A semiconductor integrated circuit (IC) device including a voltage controlled oscillator (VCO) having an amplifier including a field-effect transistor (FET), the VCO comprising a voltage controlled capacitor, the voltage controlled capacitor comprising:

an inversion amplifier comprising an FET, an amp gain of the inversion amplifier being controlled by a voltage; and a capacitor connected between an input and an output of the inversion amplifier.

3. The semiconductor IC device as claimed in claim 2, further comprising a connection terminal connecting an inductor and a capacitor, the inductor and the capacitor forming a part of the VCO.

4. An electronic device including a voltage controlled oscillator (VCO), the electronic device comprising:

the voltage controlled oscillator (VCO) comprising a voltage controlled capacitor, the voltage controlled capacitor comprising:

an inversion amplifier comprising an FET, an amp gain of the inversion amplifier being controlled by a voltage; and a capacitor connected between an input and an output of the inversion amplifier; and a controller controlling an oscillation frequency of the VCO.

* * * * *